United States Patent [19]
Zimnicki et al.

[11] Patent Number: 6,093,997
[45] Date of Patent: Jul. 25, 2000

[54] EMBEDDED PIEZOELECTRIC RESONATOR

[75] Inventors: Charles Zimnicki; James F. Caruba, both of Bartlett, Ill.

[73] Assignee: CTS Corporation, Elkhart, Ind.

[21] Appl. No.: 09/128,124

[22] Filed: Aug. 3, 1998

[51] Int. Cl.$^7$ .................................................. H01L 41/04
[52] U.S. Cl. ...................... 310/352; 310/351; 310/348; 310/345
[58] Field of Search ................... 310/348, 345, 310/351, 352

[56] References Cited

U.S. PATENT DOCUMENTS

| | | | |
|---|---|---|---|
| 3,566,164 | 2/1971 | Boillat et al. | 310/352 |
| 5,030,875 | 7/1991 | Knecht | 310/346 |
| 5,250,870 | 10/1993 | Fenlon et al. | 310/345 |
| 5,747,916 | 5/1998 | Sugimoto et al. | 310/348 |
| 5,880,553 | 3/1999 | Okeshi et al. | 310/352 |

*Primary Examiner*—Nestor Ramirez
*Assistant Examiner*—Peter Medley

[57] ABSTRACT

A piezoelectric resonator (12) is embedded within an electrically insulating substrate assembly (36), such as a multi-layer printed circuit board. Electrical conductors (22,24) extend from electrodes of the resonator (12) through holes (32) in upper and lower layers (26,29) of the substrate assembly (36) and connect to electrical traces (34). The lower layer (29) has a pocket which forms a cavity (38) within the substrate assembly (36) adapted to contain the piezoelectric resonator (12). The conductors (22,24) support the resonator (12) such that the resonator (12) does not contact the assembly (36). As the resonator is substantially larger than associated electrical components, embedding it within a substrate eliminates the size penalty that is normally required to mount a large piezoelectric resonator.

20 Claims, 3 Drawing Sheets

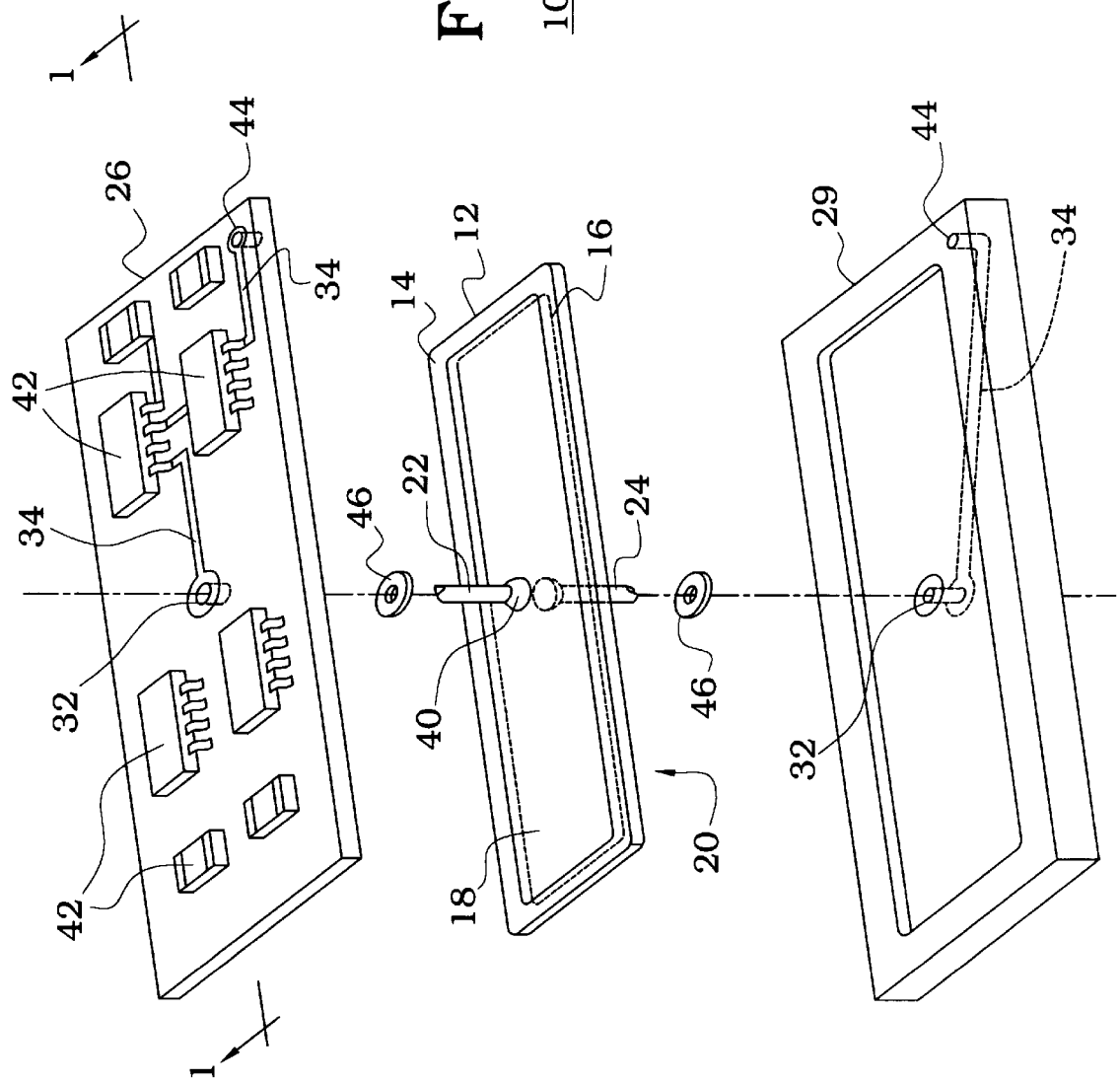

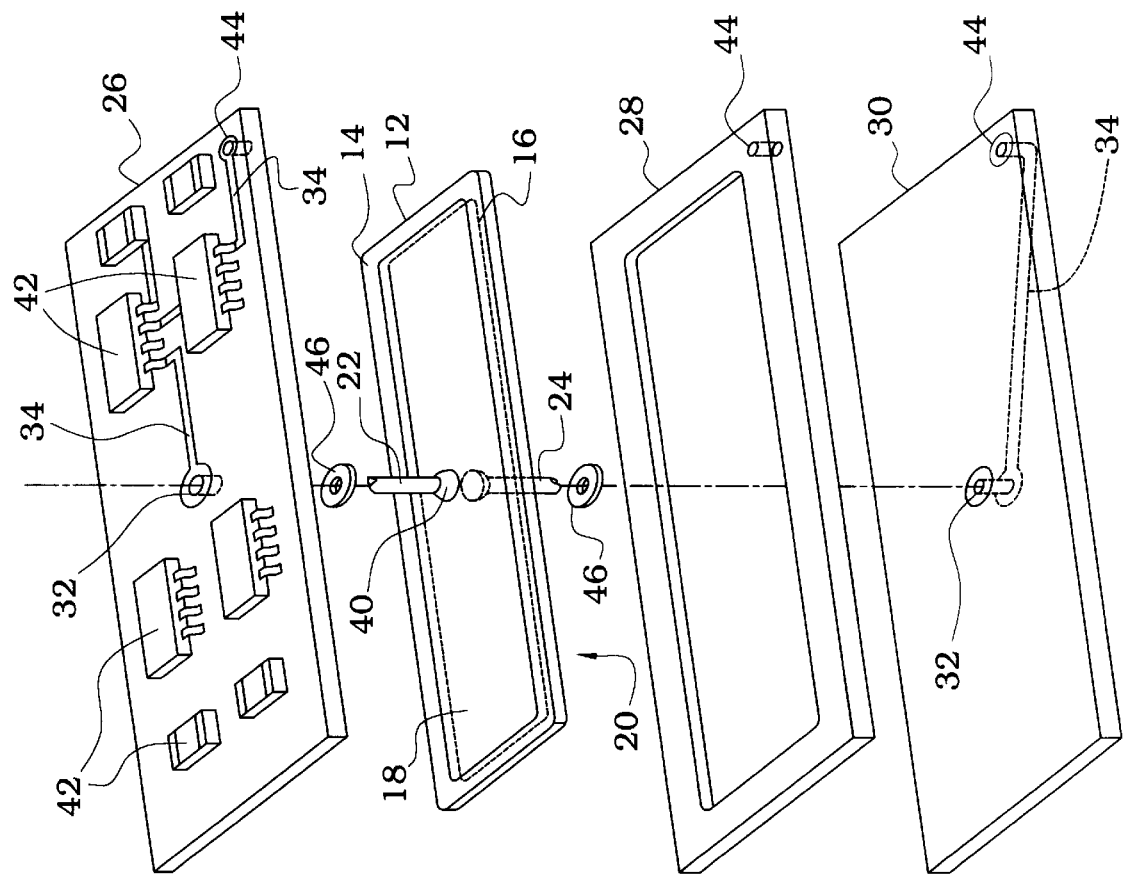

EMBEDDED PIEZOELECTRIC RESONATOR

FIELD OF THE INVENTION

The present invention relates generally to piezoelectric resonators and oscillators and, in particular, to packaging for piezoelectric resonators and oscillators.

BACKGROUND OF THE INVENTION

Piezoelectric devices provide very efficient transfer of energy. As such, these devices can be used to provide very efficient conversions devices such as for DC—DC converters, power transformers, and the like. However, the power handling capability of piezoelectric devices is limited. Therefore, applications requiring higher power levels require correspondingly larger piezoelectric devices. Such devices would occupy a substantial amount of space on a printed circuit board, much more so than other electronic components used in the specific power conversion circuit. In addition, it is desirable to provide packaging to protect the piezoelectric device from the environment, even for non-hermetic applications such as in power conversion devices. This additional packaging further increases the space needed to mount the piezoelectric device in the circuit.

Typically, piezoelectric packaging consists of a metal or a ceramic. Not only do these packaging schemes add substantial size to the piezoelectric device, they also add considerable cost to the piezoelectric device. In particular, non-standard or large packages can cost more than the piezoelectric portion of the device itself. Moreover, metal packaging can be a distinct disadvantage in high voltage applications as arcing can occur between the regions of the piezoelectric resonator that are at high potentials and the metal package.

There is a need for a piezoelectric resonator that would take up minimal or zero space on top of a printed circuit board. In addition, it would be desirable to provide as large a piezoelectric resonator as needed for a specific power conversion circuit application without penalty of circuit board space or total overall circuit height. Further, it would be advantageous to isolate regions of the piezoelectric resonator that are at high potentials to prevent high voltage discharges to other portions of the specific circuit. Moreover, it would be beneficial to provide a packaged piezoelectric resonator that adds minimal cost to a power conversion circuit.

BRIEF DESCRIPTION OF THE DRAWINGS

FIG. 2 is an exploded view of an embedded piezoelectric resonator, in accordance with the present invention; and FIG. 3 is an exploded view of an alternative embodiment of an embedded piezoelectric resonator, in accordance with the present invention

DETAILED DESCRIPTION OF THE PREFERRED EMBODIMENT

Figure 1:
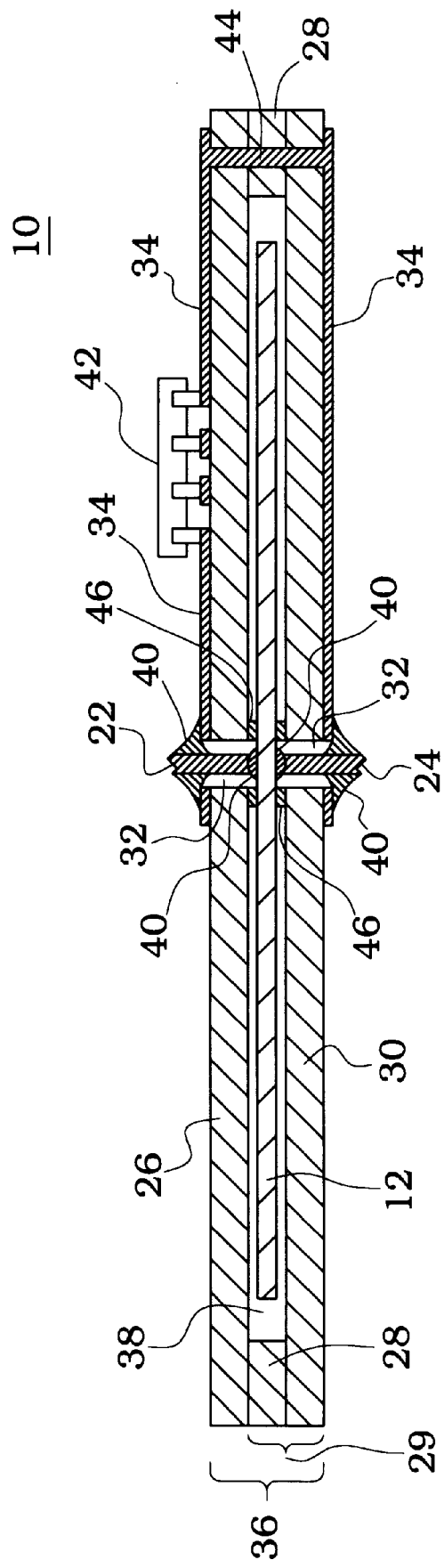
FIG. 1 is a cross sectional side view of an embedded piezoelectric resonator, in accordance with the present invention.

The present invention provides a piezoelectric resonator embedded within an electrically insulating substrate assembly, such as a printed circuit board. Electrical components associated with the resonator, so as to drive it appropriately, are mounted on top of the substrate assembly. In this way, the resonator itself takes up no space on top of the printed circuit board. This configuration allows the use of as large a piezoelectric resonator as is needed for a specific power conversion circuit application without the penalty of additional circuit board space or total overall circuit height. Further, the present invention advantageously isolates the regions of the piezoelectric resonator that are at high potentials to prevent high voltage discharges to other portions of the specific circuit. All these advantages are provided at a minimal additional cost to a power conversion circuit.

As shown in FIGS. 1 and 2, the present invention embodies an embedded piezoelectric resonator apparatus 10. The apparatus 10 includes a resonator which is a flat piezoelectric plate 12 having an upper surface 14 and a lower surface 16. Disposed on the upper and lower surfaces 14,16 are opposing top and bottom electrodes 18,20, respectively. Generally, for power conversion applications, the piezoelectric plate is rectangular in shape and can be quite large. Often, the piezoelectric plate will have length and width dimensions of 1 centimeter or larger with a thickness of about two millimeters or less.

Preferably in the present invention, the piezoelectric plate 12, when driven by an alternating electrical signal, oscillates in an extensional mode of operation so as to produce a high voltage. In a preferred embodiment, the embedded resonator is capable of handling high voltage power levels of greater than 0.2 watts. However, it should be recognized that other types of piezoelectric devices and vibrational modes can be used successfully in the present invention.

In the present invention, a first and a second electrical conductor 22,24 are connected to the top and bottom electrodes 18,20, respectively, of the piezoelectric plate 12. The electrical conductors 22,24 are connected to their respective electrodes 18,20 by an adhesive 40 selected from at least one of the group of solder, conductive epoxy, and conductive silicone. Rigid adhesives are preferred as they reduce dampening effects. Preferably, the electrical conductors 22,24 are connected to their respective electrodes 18,20 at opposing locations substantially at a node of minimum vibration of the piezoelectric plate 12 such that the electrical conductors 22,24 minimize any damping of piezoelectric oscillations. In other words, the electrical conductors 22,24 are attached to the piezoelectric plate 12 at vibrational nodes of minimum displacement.

The resonator described above is embedded within a substrate assembly 36, which is of an electrically insulating material such that the potential of arcing from the resonator is reduced. In particular, the substrate assembly 36 is made of a material selected from one of the group of a ceramic, a reinforced epoxy, and a polyimide. Preferably, the substrate assembly 36 is a multilayer printed circuit board made from a glass or graphite reinforced epoxy. More preferably, the printed circuit board is made of FR-4 epoxy, as is known in the art.

The substrate assembly 36 includes at least two layers. An upper substrate layer 26 is substantially flat and has a hole 32 adapted to receive the associated first electrical conductor 22 attached to the resonator. A lower shaped substrate 29, as shown in FIG. 3, has a pocket formed therein. The pocket can be provided by a routing operation or other grinding process known in the art. The upper substrate layer 26 and the lower shaped substrate are joined so as to form the substrate assembly 36. The pocket of the lower shaped substrate 29 defines a cavity 38 within the substrate assembly 36 adapted to contain the piezoelectric plate 12. The upper substrate layer 26 and lower shaped substrate 29 include disposed electrical traces 34 for connecting to the associated first and second electrical conductors 22,24. Preferably, the cavity 38 has a height of about two millimeters or less and the plate has a thickness of less then two millimeters.

In an alternate embodiment, as shown in FIG. 3, the lower shaped substrate 29 includes at least two layers; a middle substrate layer 28 and a lower substrate layer 30, each being substantially flat and integrally connected. The lower substrate layer 30 has a hole 32 adapted to receive the second electrical conductor 24 attached to the resonator. The lower substrate layer 30 also includes a disposed electrical trace 34 for connecting to the electrical conductor 24. The middle substrate layer 28 is interposed between the upper and lower substrate layers 26,30 so as to form the substrate assembly 36. The middle substrate layer 28 has a large opening therethrough such that the opening defines a cavity 38 within the substrate assembly 36 adapted to contain the piezoelectric plate 12.

As assembled, the present invention includes the first electrical conductor 22 extending upwardly from the top electrode 18 and at least partially through the hole 32 in the upper substrate layer 28. The first electrical conductor 22 is electrically connected to an electrical trace 34 on the upper substrate layer 26. The second electrical conductor 24 extends downwardly from the bottom electrode 20 and at least partially through the hole 32 in the lower shaped substrate 29 (FIG. 3) or lower substrate layer 30 (FIG. 2). The second electrical conductor 24 is electrically connected to an electrical trace 34 on the lower shaped substrate 29 (FIG. 3) or lower substrate layer 30 (FIG. 2). The electrical conductors 22,24 are connected to their associated electrical traces 34 by an adhesive 40 selected from at least one of the group of solder, conductive epoxy, and conductive silicone.

Preferably, the electrical conductors 22,24 support and suspend the piezoelectric plate 12 within the cavity 38 such that edges of the plate 12 do not contact the substrate assembly 36. However, it was found that the resonator will still operate satisfactorily when contacting the assembly. In addition, the plate is of such a large size that the effects of contamination of the surfaces of the plate do not degrade resonator performance significantly. Therefore, it is not a requirement of the present invention that the cavity be hermetic, sealed in a vacuum, or filled with an inert gas.

In a preferred embodiment, the piezoelectric plate 12 is separated and held apart from the substrate assembly 36 by standoff pads 46 encircling each conductor 22,24. It is desired that the standoff pads 46 are elastic and can made be of foam, silicone, felt, plastic, plasticized rubber, and the like. However, it should be recognized that the material chosen should not deteriorate over time and temperature. The standoff pads 46 serve to securely hold the piezoelectric plate 12 in place. In particular, the standoff pads 46 prevent any mechanical shock damage to the piezoelectric plate 12.

Also in a preferred embodiment, the embedded piezoelectric resonator apparatus of the present invention further includes various electrical components 42 disposed on the upper substrate layer 26 and coupled to the electrodes 18,20 through the associated electrical traces 34. In particular, the first electrical conductor 22 is coupled to the electrical components 42 and the electrical traces 34 through the hole 32 in the upper substrate layer 26, and the second electrical conductor 24 is coupled to the electrical components 42 and the electrical traces 34 through the hole 32 in the lower shaped substrate 29 (FIG. 3) or lower substrate layer 30 (FIG. 2). Specifically, the second electrical conductor 24 is coupled to the electrical components 34 by a wraparound trace (not shown) extending around an external periphery of the substrate assembly 36, or through an auxiliary electrical trace 44 extending around an edge of the substrate assembly 36 or through a via 44 extending through the substrate assembly 36.

The present invention, when utilized in a power conversion application such as a DC—DC converter, advantageously yields a ten times size reduction over prior art converters. In particular, the profile of the entire circuit is much lower than is available in the art. In addition, this was accomplished using a high voltage piezoelectric device without arcing problems between the regions of the piezoelectric portion that are at high potentials and the remainder of the circuit, since the printed circuit board itself serves to electrically isolate the piezoelectric resonator. Further, the slight cost increase in using a multilayer circuit board configuration is more than offset by the savings realized by not having to provide a package for the piezoelectric resonator and the overall reduced printed circuit board area used.

Although various embodiments of this invention have been shown and described, it should be understood that various modifications and substitutions, as well as rearrangements and combinations of the preceding embodiments, can be made by those skilled in the art, without departing from the novel spirit and scope of this invention.

What is claimed is:

1. An embedded piezoelectric resonator apparatus comprising:

a flat piezoelectric plate with upper and lower surfaces with opposing top and bottom electrodes disposed thereon, respectively;

a first and a second electrical conductor connected to the top and bottom electrodes, respectively;

an upper substrate layer having an electronic circuit thereon and being substantially flat and having an orifice adapted to receive the first electrical conductor and an electrical trace disposed thereon for connecting the first electrical conductor to said electronic circuit; and a lower substrate having an orifice adapted to receive the second electrical conductor and an electrical trace for connecting to the second electrical conductor, the lower substrate having a pocket in one surface thereof facing said upper substrate;

the upper substrate layer and lower substrate forming a substrate assembly, the pocket of the lower substrate defining a cavity within the substrate assembly adapted to contain the piezoelectric plate;

the first electrical conductor extending upwardly from the top electrode of said piezoelectric plate and at least partially through the orifice in the upper substrate layer and electrically connecting to said electrical trace on the upper substrate layer;

the second electrical conductor extending downwardly from the bottom electrode and at least partially through the orifice in the lower substrate and electrically connecting to an electrical trace on the lower substrate.

2. The embedded piezoelectric resonator apparatus of claim 1, wherein the substrate assembly is of an electrically insulating material, and wherein the piezoelectric plate, when driven by an alternating electrical signal, oscillates in an extensional mode of operation so as to produce a high voltage.

3. The embedded piezoelectric resonator apparatus of claim 1, wherein the electrical conductors are connected to their respective electrodes and electrical traces by an adhesive selected from at least one of the group of solder and conductive epoxy.

4. The embedded piezoelectric resonator apparatus of claim 1, wherein the electrical conductors support and suspend the piezoelectric plate within the cavity such that edges of the plate do not contact the substrate assembly.

5. The embedded piezoelectric resonator apparatus of claim 4, wherein the electrical conductors are connected to their respective electrodes at opposing locations substantially at a node of minimum vibration of the piezoelectric plate such that the electrical conductors minimize any damping of piezoelectric oscillations.

6. The embedded piezoelectric resonator apparatus of claim 1, wherein the lower substrate includes a middle substrate layer and a lower substrate layer, each being substantially flat and integrally connected, the middle substrate layer being interposed between the upper and lower substrate layers so as to form the substrate assembly, the middle substrate layer having an opening therethrough such that the opening defines the cavity within the substrate assembly.

7. The embedded piezoelectric resonator apparatus of claim 1, wherein the cavity has a height of about two millimeters or less.

8. The embedded piezoelectric resonator apparatus of claim 1, further comprising electrical circuit components disposed on the substrate assembly and connected to the electrical traces, at least one of and electrical traces coupled to at least one of the first and second conductors through an auxiliary electrical trace, the auxiliary electrical trace comprising an electrical connection selected from one of the group of a trace extending around an edge of the substrate assembly and a via extending through the substrate assembly.

9. The embedded piezoelectric resonator apparatus of claim 1, wherein the substrate assembly is of a material selected from one of the group of a ceramic, a reinforced epoxy, and a polyimide.

10. An embedded piezoelectric resonator apparatus, comprising:

a flat piezoelectric plate with upper and lower surfaces with opposing top and bottom electrodes disposed thereon, respectively;

a first and a second electrical conductor connected to the top and bottom electrodes, respectively, at locations substantially at a node of minimum vibration of the piezoelectric plate such that the electrical conductors minimize any damping of piezoelectric oscillations;

an upper printed circuit board layer being substantially flat and having a hole adapted to receive the first electrical conductor and an electrical trace disposed thereon for connecting to the first electrical conductor; and a lower shaped printed circuit board having a hole adapted to receive the second electrical conductor and an electrical trace for connecting to the second electrical conductor, the lower shaped printed circuit board having a pocket in one surface thereof;

the upper printed circuit board layer and lower shaped printed circuit board are connected so as to form a printed circuit board assembly, the pocket of the lower shaped printed circuit board defining a cavity within the printed circuit board assembly adapted to contain the piezoelectric plate;

the first electrical conductor extending upwardly from the top electrode and at least partially through the hole in the upper printed circuit board layer and electrically connecting to an electrical trace on the upper printed circuit board layer;

the second electrical conductor extending downwardly from the bottom electrode and at least partially through the hole in the lower shaped printed circuit board and electrically connecting to an electrical trace on the lower shaped printed circuit board.

11. The embedded piezoelectric resonator apparatus of claim 10, wherein the piezoelectric plate, when driven by an alternating electrical signal, oscillates in an extensional mode of operation so as to produce a high voltage.

12. The embedded piezoelectric resonator apparatus of claim 10, wherein the electrical conductors are connected to their respective electrodes and electrical traces by an adhesive selected from at least one of the group of solder and conductive epoxy.

13. The embedded piezoelectric resonator apparatus of claim 10, wherein the electrical conductors support and suspend the piezoelectric plate within the cavity such that edges of the plate do not contact the printed circuit board assembly.

14. The embedded piezoelectric resonator apparatus of claim 10, wherein the cavity has a height of two millimeters or less.

15. The embedded piezoelectric resonator apparatus of claim 10, further comprising electrical circuit components disposed on the upper printed circuit board layer and connected to the electrical traces, the first electrical conductor coupled to the electrical circuit components through the electrical traces, the second electrical conductor coupled to the electrical circuit components through a via extending through the printed circuit board assembly.

16. An embedded piezoelectric resonator apparatus, comprising:

a flat piezoelectric plate with upper and lower surfaces with opposing top and bottom electrodes disposed thereon, respectively, the piezoelectric plate, when driven by an alternating electrical signal, oscillates in an extensional mode of operation so as to produce a high voltage;

a first and a second electrical conductor connected to the top and bottom electrodes, respectively, the electrical conductors are connected to their respective electrodes at locations substantially at a node of minimum vibration of the piezoelectric plate such that the electrical conductors minimize any damping of piezoelectric oscillations;

an upper printed circuit board layer being substantially flat and having a hole adapted to receive the first electrical conductor and an electrical trace disposed thereon for connecting to the first electrical conductor; and a lower shaped printed circuit board having a hole adapted to receive the second electrical conductor and an electrical trace for connecting to the second electrical conductor, the lower shaped printed circuit board having a pocket in one surface thereof;

the upper printed circuit board layer and lower shaped printed circuit board are connected so as to form a printed circuit board assembly, the pocket of the lower shaped printed circuit board defining a cavity within the printed circuit board assembly adapted to contain the piezoelectric plate;

the first electrical conductor extending upwardly from the top electrode and at least partially through the hole in the upper printed circuit board layer and electrically connecting to an electrical trace on the upper printed circuit board layer;

the second electrical conductor extending downwardly from the bottom electrode and at least partially through the hole in the lower printed circuit board layer and electrically connecting to an electrical trace on the lower printed circuit board layer;

the electrical conductors supporting and suspending the piezoelectric plate within the cavity such that edges of the plate do not contact the printed circuit board assembly.

17. The embedded piezoelectric resonator apparatus of claim 16, wherein the electrical conductors are connected to their respective electrodes and electrical traces by an adhesive selected from at least one of the group of solder and conductive epoxy.

18. The embedded piezoelectric resonator apparatus of claim 16, wherein the piezoelectric plate is separated and held apart from the substrate assembly by standoff pads encircling each conductor.

19. The embedded piezoelectric resonator apparatus of claim 16, further comprising electrical components disposed on the printed circuit board assembly and connected to the electrical traces, at least one of and electrical traces coupled to at least one of the first and second conductors through an auxiliary electrical trace, the auxiliary electrical trace comprising an electrical connection selected from one of the group of a trace extending around an edge of the printed circuit board assembly and a via extending through the printed circuit board assembly.

20. The embedded piezoelectric resonator apparatus of claim 19, wherein the electrical components and the piezoelectric resonator comprise a voltage transformer circuit, and wherein the piezoelectric resonator is useful for power levels greater than 0.2 watts.

* * * * *